United States Patent [19]

Lafon

[11] Patent Number: 5,274,674
[45] Date of Patent: Dec. 28, 1993

[54] METHOD OF CONTROLLING A THRESHOLD DECODER FOR A SIGNAL HAVING SEVERAL LEVELS AND BEING AFFECTED BY ECHOES, AND TELEVISION RECEIVER PROVIDED WITH SUCH A DECODER

[75] Inventor: Philippe Lafon, Puteaux, France

[73] Assignee: U.S. Philips Corporation, New York, N.Y.

[21] Appl. No.: 712,221

[22] Filed: Jun. 7, 1991

[30] Foreign Application Priority Data

Jun. 19, 1990 [FR] France .................. 90 07649

[51] Int. Cl.⁵ .............. H04L 25/06; H04L 25/10
[52] U.S. Cl. .................... 375/76; 371/5.5; 358/174; 375/98
[58] Field of Search .......... 375/76, 98, 17, 10; 455/232.1, 234.1, 234.2; 358/174; 371/5.1, 5.3, 5.5; 329/350

[56] References Cited

U.S. PATENT DOCUMENTS

| | | | |
|---|---|---|---|
| 4,034,340 | 7/1977 | Sant'Agostino | 340/146 |
| 4,479,255 | 10/1984 | Gessen et al. | 455/234.2 |
| 4,625,240 | 11/1986 | Yablonski et al. | 455/234.2 X |
| 4,799,106 | 1/1989 | Moore et al. | 358/174 X |

FOREIGN PATENT DOCUMENTS 60-249447 12/1985 Japan .

OTHER PUBLICATIONS

Search Report.

*Primary Examiner*—Curtis Kuntz
*Assistant Examiner*—Tesfaldet Bocure
*Attorney, Agent, or Firm*—Richard A. Weiss

[57] ABSTRACT

For controlling the threshold of a threshold decoder with a logic signal having several levels (for example a duobinary signal) which may be affected by echoes, and in which the threshold value of the decoder is programmable, the threshold of the decoder is adapted in dependence upon the measurement of the binary error rate, when there are echoes. Starting from a given threshold value (A), the corresponding binary error rate (P) is measured and, based on this binary error rate, a value which is referred to as criterion (K1) is computed (by adding a first fixed quantity to the value of the measured error rate and by multiplying the total by a second fixed quantity), subsequently the threshold value of the decoder is incremented step by step (B, C, D) and the criterion is recomputed at each step and used if it has become smaller, and when the binary error rate exceeds the criterion for the first time (D), the threshold value is stored and the process is continued by decrementing (C, B, A, E, F, G, H), and when the binary error rate (H) exceeds the criterion (K2) for the second time, half the sum of the two extreme values found (D,H) is chosen as the threshold control value.

25 Claims, 2 Drawing Sheets

METHOD OF CONTROLLING A THRESHOLD DECODER FOR A SIGNAL HAVING SEVERAL LEVELS AND BEING AFFECTED BY ECHOES, AND TELEVISION RECEIVER PROVIDED WITH SUCH A DECODER

BACKGROUND OF THE INVENTION

The invention relates to a method of controlling the threshold of a threshold decoder for a signal having several levels, in which the threshold value of the decoder is programmable. The invention also relates to a television receiver provided with a decoder controlled in accordance with the method.

The invention provides a means for utilizing the possibilities of a threshold decoder when a signal, having several levels, is, perturbed by quasi-stationary echoes. It is thus, typically usable in the case of cable distribution networks, for example, in a MAC standard for optimally controlling each receiver.

The threshold of threshold decoders is usually controlled as a function of the amplitude of the signal without taking into account its behavior in the presence of echoes. In the case of MAC, the control is effected by adapting the threshold with respect to the black/white level in line 624.

The echoes produce directly visible faults in the image and a noise which is referred to as clamping noise and which is extremely troublesome, particularly for long echoes. Echoes degrade the error rate in binary data.

To improve the behavior of decoders in the presence of echoes, it is known to utilize an equalizer. The effectiveness of such arrangements is not disputed, but they are quite costly.

SUMMARY OF THE INVENTION

The invention is based on the recognition that the optimum control of the threshold of the decoder, which is realized with a noisy signal not affected by echoes, may not be the best control when there are echoes.

The method according to the invention is therefore characterized in that the threshold of a decoder is adapted in dependence upon the measurement of the binary error rate at the output of a decoder when the input signal in the decoder is affected by echoes.

As such, the control criterion is no longer adapted with respect to the reference level of line 624 in the case of a MAC signal.

The improvement of the control of the decoding threshold in the presence of echoes has no negative effect on the image, but generally provides an improvement of the error rate which is variable in accordance with the type of echo and which may range as far as two orders of magnitude, particularly in the case of short and powerful echoes. Inter alia, the method even remains advantageous when an equalizer is used with it because it permits correcting of certain faults which the equalizer does not correct.

In a particular embodiment, the method is characterized in that, starting from a given threshold value, the corresponding binary error rate is measured and, based on this binary error rate, a value which is referred to as the criterion and which exceeds the binary error rate is computed and stored. Thereafter the threshold value of the decoder is incremented step by step and the binary error rate is measured at each step and compared with the criterion, and if the rate is smaller than the criterion, the incrementation is continued. The threshold value is stored and the direction of incrementation is reversed when the binary error rate exceeds the criterion for the first time. The incrementation is stopped by storing the last threshold value when the binary error rate exceeds the criterion for the second time. Half the sum of the two threshold values, i.e., at the instant of reversing the direction of incrementation and at the instant of stopping the incrementation is chosen as the threshold control value.

A value which exceeds the least step provided by the decoder can advantageously be chosen as a digital value of the threshold incrementation step. The incrementation step at the start may be either positive or negative, i.e. the incrementation may be a decrementation.

Thus, the order of magnitude of the threshold, which can already be utilized profitably, is obtained rapidly. It eliminates the problems of measuring precision, and probably the best value is obtained. Inter alia, divergences during such a process have never been found experimentally.

It is advantageous during measurement of the binary error rate at the start of the to store its value, which is tentatively supposed to be the optimal binary error rate, when and when subsequently at each incrementation step to compare the measured binary error rate with the optimal binary error rate; and if the measured binary error rate is smaller than the optimal binary error rate, to replace the value of the optimal binary error rate in the memory by the new value actually measured and to recomputed and stored a new criterion before continuing the incrementation.

The value of the criterion, thus, improves during the process and is better adapted for a subsequent stage, which may appreciably enhance the optimization of the control, in which a second process analogous to the first is performed. In the second process, the last criterion computed during the first process is used as the criterion and the last threshold value used in the first process is used as the starting value for the threshold. Thereafter the threshold value of the decoder is incremented step by step with a step which is smaller than that used during the first process, and the binary error rate is measured at each step and compared with the criterion. When the binary error rate first becomes smaller than the criterion, a first value is stored which is the value of the threshold at that instant. When the binary error rate thereafter first exceeds the criterion, the incrementation is stopped and a second value is store. The second value is the value of the threshold at that instant. Half the sum of the above-mentioned first and second threshold values is chosen as the threshold control value.

For this second process, the last value provided by the decoder can advantageously be chosen as the digital value of the threshold incrementation step. Thus, a precise value is obtained without using too much time despite the smaller step. This is because the criterion is smaller than at the start of the first process. When carrying out the two stages of the above-mentioned process, the control time is approximately one minute when using the currently available materials.

In all stages of the process, the criterion is computed by adding a first fixed quantity to the value of the measured error rate and by multiplying the total by a second fixed quantity.

For the sake of security, it is sensible to verify whether the binary error rate remaining after control is smaller than the criterion and, in the opposite case, to restart the whole process. This can be done whenever a receiver whose decoder is controlled in this manner is switched on.

Because echoes are generally the same whenever the decoder is used, for example, in the case of cable networks, it is advantageous to store the control value found at each transmission which can be received by the decoder. It is, thus, not necessary to repeat the control process whenever the transmission is changed.

A receiver according to the invention, comprising a threshold decoder having a digital control input for applying a threshold value thereto, module for measuring the binary error rate at the output of the decoder, and a microprocessor. The microprocessor is loaded with a program which, based on several measuring results provided by the module for measuring the binary error rate, computes a digital value for controlling the threshold of the decoder and applies that digital value to the digital control input.

Advantageously, the receiver includes, inter alia, permanent-memory sites for storing the threshold control values.

BRIEF DESCRIPTION OF THE DRAWINGS

The invention will now be described in greater detail by way of a non-limitative example, with reference to the accompanying drawing in which.

DETAILED DESCRIPTION OF PREFERRED EMBODIMENTS OF THE INVENTION

The following description is based on an example in which the signal is of the MAC type, but those skilled in the art can easily adapt the method and the arrangement to any other type of signal comprising at least digital signal parts at several levels.

Figure 1:
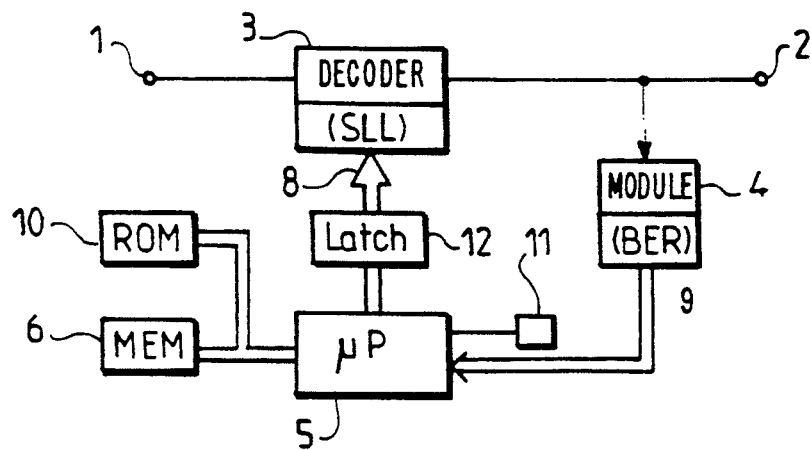
FIG. 1 is a circuit diagram of an arrangement for performing the method, which arrangement forms part of a television receiver according to the invention.

The arrangement shown in FIG. 1, which forms part of a television receiver, has an input 1 to which a television signal is applied, for example, of the MAC type, which signal may be affected by echoes. This signal is applied to a decoder 3 which has a digital control input (for example, of seven bits) for establishing a threshold value in the decoder. The decoded signal is supplied at an output 2 and applied to a module 4 for measuring the binary error rate, which module has an output 9 for supplying the measuring result which is referenced BER. A microprocessor 5 provided with a memory 6 for transitorily storing values can compute a digital value, BER, on the basis of the measuring value read at the output 9 and supply the resultant computed value to a connection 8 which is connected to the digital threshold control input referenced SLL. A permanent memory 10 comprises a threshold starting value and two threshold incrementation step values.

If it is supposed, for example, that the threshold control input SLL is a digital input of seven bits, a digital value of three may be chosen as the first incrementation step value. The second step value will comprise one bit.

In practice, the majority of the elements shown as discrete elements in FIG. 1 are incorporated in either the microprocessor or in the decoder.

Figure 4:
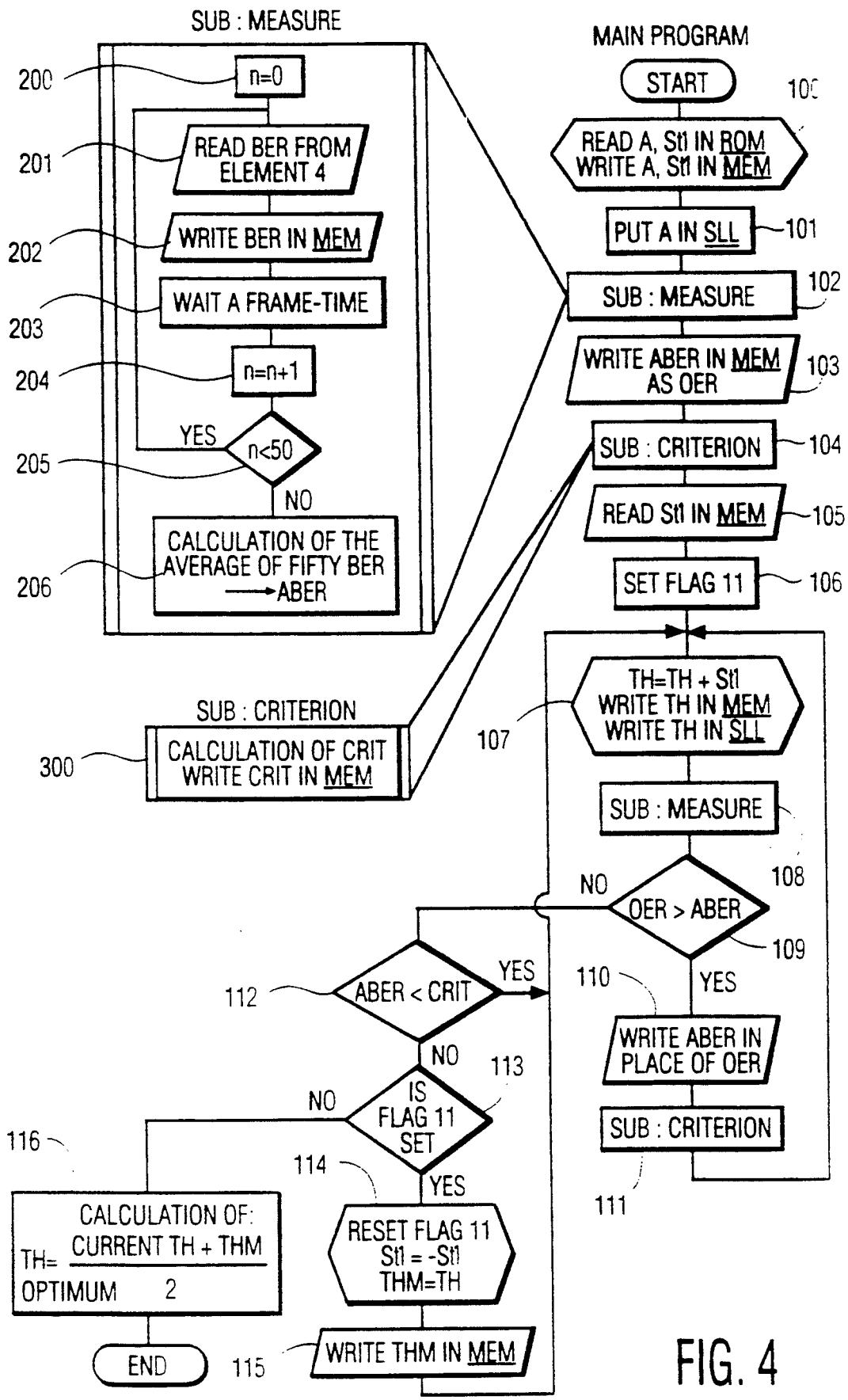
FIG. 4 is a microprocessor program flow chart for use in carrying out the invention.

The microprocessor is loaded with a program, such as the one depicted in FIG. 4 which, based on several measuring results provided by the module, computes a digital value for controlling the threshold of the decoder and applies this digital value to the digital control input. This program involves the following operations.

It is first supposed that the degradation produced is below that which would render the threshold decoder inoperative (impossible to synchronize) and that the echo perturbation can be considered as stationary (cable distribution).

During an initiation stage the microprocessor reads the starting value of the threshold (A of FIG. 2) from in the memory 10 and writes it in the memory 6, and then presents it (via a latch circuit 12 for maintaining the value) to the connection 8 for establishing this threshold at the input SLL of the decoder 3. The measuring module 4 counts the measuring errors from digital data coded in a Golay code which are present in the MAC data. Because of the Golay coding, it is possible to know whether the received data is correct or not. For example, the measuring module counts (by cumulating them) the errors in the data during an entire field at each burst of Golay-coded data; then it stores the cumulated value found, BER, before it is reset to zero at the start of the next field. Because of this storage, a measuring value BER, is permanently available.

Because the variance of the result of measuring the error rate is quite large, it is preferable to take the average of a certain number of BER measurements, for example, fifty measurements. The microprocessor, thus, in step 102 of FIG. 4 reads fifty times at the field interval the BER value at the output of the module 4 and averages them. (Steps 200–206 of FIG. 4 show the details of step 104 when fifty BER measurements are used.) This takes about two seconds. Then, the microprocessor writes this average ABER, into the memory 6 as the initial value of the optimal error rate, OER.

Based on the value of the binary error rate, in this case an average of BERs, the microprocessor computes and writes a value referred to as the CRITERION into the memory 6, step 104 of FIG. 4 (details of which are shown in step 300). The following formula is used for its computation:

$$CRITERION = 2*(ABER+5)$$

ABER and CRITERION are expressed in thousandths of percents).

The criterion is, thus, obtained by adding a first fixed quantity (here: 5) to the average measured value of the error rate and by multiplying the total by a second fixed quantity (here: 2). The added quantity (here: 5) which is negligible for high error rates will be the principal factor for low rates in the sum (ABER+5), and the influence of dispersions on the measurement of the binary error rate is, thus, reduced, which dispersions are stronger as the binary error rate is weaker. For example, for an average binary error rate of $10^{-5}$, or ABER=1, measuring results ranging from zero to 2 may be obtained, but the criterion itself only varies between 10 and 14, i.e. much less. Moreover, the multiplication coefficient of 2 has for its object to provide a margin in the comparison between the averaged measured binary error rate and the criterion in order to avoid random comparison results.

In step 105, the microprocessor reads, from the memory 10, the first value of the incrementation step and writes it into the memory 6. In step 106, it positions (or sets) a flag 11 which is provided to note a change in the direction of incrementation of the threshold. The starting value of the threshold may be, for example, the standard value provided in the prior art for controlling the threshold.

The microprocessor subsequently performs the incrementation process. In step 107, it increments the value of the threshold in the memory 6 by one step, for example, st1 of FIG. 2, and applies the new value, for example, B of FIG. 2, to the connection 8. Then, in step 108 (the flow chart details are more fully shown in steps 200-206), the measurement of the error rate by counting and computing the average BERs as described hereinbefore is made. After the delay required for this measurement, the microprocessor compares, in step 109, the value of the measured average binary error rate, ABER, with the value of the optimal binary error rate, ORE, which is stored in the memory 6. If the value of the average binary error rate, ABER, is smaller than the optimal error rate, ORE, in step 110, the microprocessor changes the optimal error rate, ORE, in the memory 6 by giving it the value of the average binary error rate actually measured. Based on the new optimal binary error, ORE, rate, in step 111 (shown more fully as step 300), the microprocessor recomputes the criterion, always with the same formula, and stores it in the memory in the place of the preceding one. If, on the other hand, the average binary error rate, ABER actually measured is larger than the optimal binary error rate, in step 112 the microprocessor compares that binary error rate with the criterion. If that binary error rate is smaller than the criterion, the microprocessor adds the value of the incrementation step to the preceding threshold value (the two values read in the memory 6), applies the new value of the threshold via the latch 12 to the connection 8 (which leads, for example, to point C of FIG. 2) and restarts the series of operations described above (measurement, comparison, etc.), and so forth.

Figure 2:
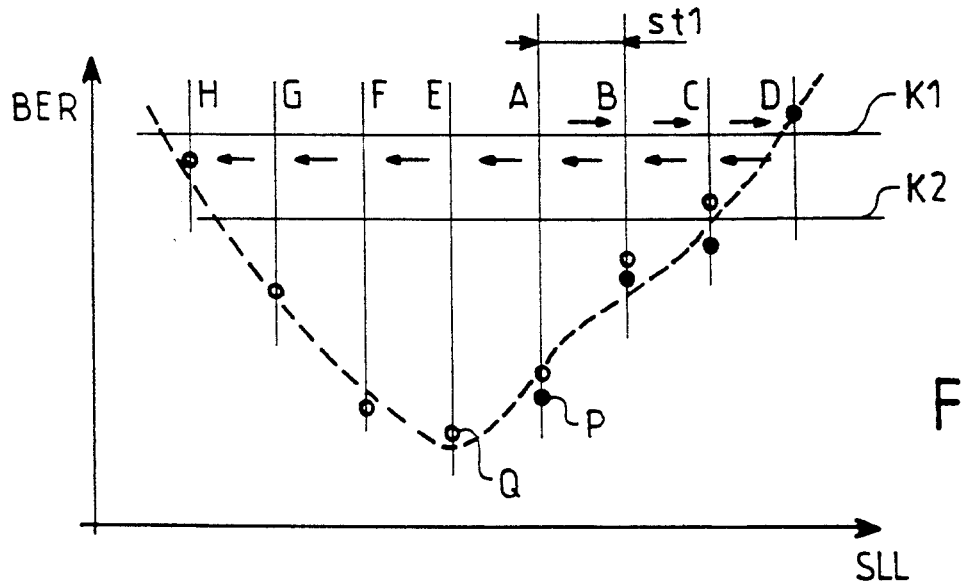
FIGS. 2 and 3 show diagrams of the error rate (BER) as a function of the threshold (SLL) for controlling the decoder to illustrate the process of determining the control value.

When a threshold value such as the one denoted by D in FIG. 2 is reached, the measured average binary error rate, ABER, is larger than the criterion referenced K1 in FIG. 2; (the measured values of the average binary error rate are indicated by black dots and their deviations, due to dispersions, from the theoretical curve are indicated by the broken-line curve). When the flag 11 indicates that this situation has been reached for the first time in step 113, in steps 114 and 115, the microprocessor changes the sign of the first value of the incrementation step in the memory 6, changes the state of the flag 11 and stores the threshold value at that instance in memory 6. After which, the process continues as before but in the opposite direction, successively passing through threshold values such as C, B, A, E, F, G, H of FIG. 2 (now the measured values of the average binary error rates are indicated by small circles).

It is to be noted that upon arrival in the process at a threshold value such as E of FIG. 2, the measured average binary error rate ABER (denoted Q) will; be smaller than the optimal binary error rate OER considered thus for (denoted as P), and replaces it (see steps 109-111). The criterion referenced K1 used until then is replaced by a smaller criterion which is referenced K2. When a process arrives at the threshold such as H of FIG. 2, the average binary error rate, ABRE, will exceed the criterion K2. In step 113, the flag 11 indicates that the direction of incrementation has been changed again. The process is then stopped and the threshold value H is stored. Half the sum of the threshold values at the instant when the direction of incrementation (T) is reversed and when the incrementation (H) is stopped, respectively, may be chosen as the control threshold value as in step 116.

Figure 3:
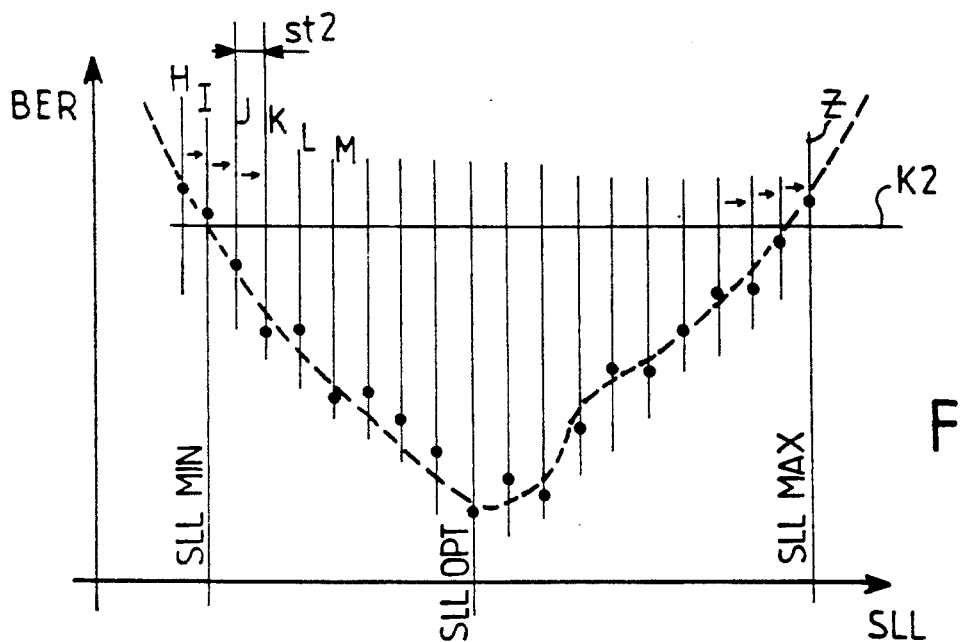

To obtain a better precision, it is preferred that the above-mentioned process be followed by; a second process, of refining the threshold value. In this second process the microprocessor reads the second value of the incrementation step smaller, for example, increased by one bit of the digital value at each step) from the memory 10 and stores it in the memory 6 in the place of the first value. The second process, thus, starts with the other unchanged preceding values of the preceding process (threshold H, criterion K2) for passing through the threshold values such as I, J, K, L, M, etc. of FIG. 3 (in which the measured values of the average binary error rate are indicated by black dots). At the instant when threshold I passes to threshold J, the average binary error rate becomes smaller than the criterion K2 and the value of the threshold J is stored. At the instant of passage to threshold Z the average binary error rate will again exceed the criterion K2, and the threshold value Z is stored and the incrementation stops.

In a final stage of the second process the threshold control value is computed by taking half the sum of the above-mentioned first and second threshold values (J and Z of FIG. 3) stored in the memory 6, and this control threshold value is applied to the connection 8 and stored with reference to the transmission received by the decoder at the instant of control. To this end, the receiver has permanent-memory sites for storing control threshold values. Thus, with the echoes being supposed to be stationary, and whenever it is desired to receive another transmission, it is sufficient to recall the correct control value previously realized for this transmission from the memory.

I claim:

1. A method of controlling a threshold decoder having a changeable threshold value, an input for receiving an input signal having several levels and being affected by echoes, and an output for outputting from said decoder a decoded output signal corresponding to said input signal and having a binary error rate which is degraded by said echoes and which changes when said threshold value is set at different values; the method comprising:

measuring the binary error rate when said threshold value is set at a first value and when said threshold value is set at a second value; and adapting said threshold value in dependence upon the binary error rate measured when said threshold value is set at said first value and the binary error rate measured when said threshold value is set at said second value.

2. The method as claimed in claim 1, wherein said threshold value is adapted by setting said threshold value to a threshold control value which is a function of said first value and said second value.

3. The method as claimed in claim 1, wherein said threshold value is initially set to a predetermined value which is greater than said second value and less than said first value.

4. The method as claimed in claim 1, wherein said threshold value is adapted by:
   (a) initially setting said threshold value to a predetermined value;
   (b) measuring the binary error rate when said threshold value is set at said predetermined value, that binary error rate being a first binary error rate;
   (c) computing a criterion value which exceeds and is based on said first binary error rate;
   (d) incrementing said threshold value by a first predetermined step value to a new incremented value and measuring the binary error rate when said threshold value is set at the new incremented value;
   (e) comparing the binary error rate measured when said threshold value is set at the new incremented value to said criterion;
   (f) repeating steps (d) and (e) until the binary error rate measured when said threshold value is set at the new incremented value exceeds said criterion;
   (g) decrementing said threshold value by said first predetermined step value to a new decremented value and measuring the binary error rate when said threshold value is set at the new decremented value;
   (h) comparing the binary error rate measured when said threshold value is set at the new decremented value to said criterion;
   (i) repeating steps (g) and (h) until the binary error rate measured when said threshold value is set at the new decremented value exceeds said criterion; and
   (j) setting said threshold value to a threshold control value which is an average of (i) the new incremented value at which the binary error rate, measured when said threshold control value is set at that new incremented value, exceeds said criterion, that new incremented value being said first value, and (ii) the new decremented value at which the binary error rate, measured when said threshold control value is set at that new decremented value, exceeds said criterion, that new decremented value being said second value.

5. The method as claimed in claim 4, wherein said first binary error rate is an optimal binary error rate, and the binary error rate measured when said threshold value is set at each new incremented and decremented value is compared with the optimal binary error rate; and when the binary error rate measured when said threshold value is set at a new incremented or decremented value is smaller than the optimal binary error rate, that binary error rate becomes the optimal binary error rate, and said criterion is recomputed based on that binary error rate before said threshold value is incremented or decremented.

6. The method as claimed in claim 1, wherein the measuring of the binary error rate includes averaging a plurality of binary error rate measurements measured when said threshold value is at a particular value.

7. The method as claimed in claim 6, wherein said plurality of binary error rate measurements is 50.

8. The method as claimed in claim 5, wherein said criterion is computed by adding a first fixed quantity to said first binary error rate to arrive at a total and multiplying the total by a second fixed quantity.

9. The method as claimed in claim 4, wherein said first predetermined step value is larger than the smallest tolerance by which said threshold value of said decoder can change.

10. The method as claimed in claim 1, wherein said threshold value is adapted by:
   (a) initially setting said threshold value to a predetermined value;
   (b) measuring the binary error rate when said threshold value is set at said predetermined value, that binary error rate being a first binary error rate;
   (c) computing a criterion value which exceeds and is based on said first binary error rate;
   (d) incrementing said threshold value by a first predetermined step value to a new incremented value and measuring the binary error rate when said threshold value is set at the new incremented value;
   (e) comparing the binary error rate measured when said threshold value is set at the new incremented value to said criterion;
   (f) repeating steps (d) and (e) until the binary error rate measured when said threshold value is set at the new incremented value exceeds said criterion;
   (g) decrementing said threshold value by said first predetermined step value to a new decremented value and measuring the binary error rate when said threshold value is set at the new decremented value;
   (h) comparing the binary error rate measured when said threshold value is set at the new decremented value to said criterion;
   (i) repeating steps (g) and (h) until the binary error rate measured when said threshold value is set at the new decremented value exceeds said criterion;
   (k) further incrementing said threshold value by a second predetermined step value which is smaller than said first predetermined step value to a new further incremented value and measuring the binary error rate when said threshold value is set at the new further incremented value;
   (l) comparing the binary error rate measured when said threshold value is set at the new further incremented value to said criterion;
   (m) repeating steps (k) and (l) until the binary error rate measured when said threshold value is set at the new further incremented value exceeds said criterion;
   (n) further decrementing said threshold value by said second predetermined step value to a new further decremented value and measuring the binary error rate when said threshold value is set at the new further decremented value;
   (o) comparing the binary error rate measured when said threshold value is set at the new further decremented value to said criterion;
   (p) repeating steps (n) and (o) until the binary error rate measured when said threshold value is set at the new further decremented value exceeds said criterion; and
   (q) setting said threshold value to a threshold control value which is an average of (i) the further incremented value at which the binary error rate, measured when said threshold value is set at that further incremented value, exceeds said criterion, that further incremented value being said first value, and (ii) the further decremented value at which the binary error rate, measured when said threshold value is set at that further decremented value, exceeds said criterion, that further decremented value being said second value.

11. The method as claimed in claim 10, wherein said second predetermined step value is equal to the smallest tolerance by which said threshold value can change.

12. The method as claimed in claim 10, wherein said first binary error rate is an optimal binary error rate, and the binary error rate measured when said threshold decoder is set at each new incremented and decremented value is compared with the optimal binary error rate; and when the binary error rate measured when said threshold value is set at a new incremented or decremented value is smaller than the optimal binary error rate, that binary error rate becomes the optimal binary error rate, and said criterion is recomputed based on that binary error rate before said threshold value is incremented or decremented.

13. The method as claimed in claim 4, wherein said criterion is computed by adding a first first fixed quantity to said first binary error rate to arrive at a total and multiplying the total by a second fixed quantity.

14. The method as claimed in claim 13, wherein said first fixed quantity is 5 and said second fixed quantity is 2.

15. The method as claimed in claim 4, wherein said threshold control value is one of a plurality of threshold values, each of which corresponds to a different channel, and wherein a threshold control value is determined for each channel and stored.

16. A method of controlling a threshold decoder having a changeable threshold value, an input for receiving an input signal having several levels and being affected by echoes, and an output for outputting from said decoder a decoded output signal corresponding to said input signal and having a binary error rate which is degraded by said echoes and which changes when said threshold value is set at different values; the method comprising:
measuring the binary error rate; and
adapting said threshold value in dependence upon the binary error rate measured so as to improve the binary error rate.

17. A television receiver for use with an input signal having several levels and being affected by echoes, comprising:
a threshold decoder having a changeable threshold value, a control input for setting said threshold value, a signal input for receiving said input signal, and an output for outputting from said decoder a decoded output signal corresponding to said input signal and having a binary error rate which is degraded by said echoes and which changes when said threshold value is set at different values;
measuring means for measuring the binary error rate; and
adapting means for adapting said threshold value in dependence upon at least one binary error rate received from said measuring means so as to improve the binary error rate.

18. The receiver as claimed in claim 17, wherein said adapting means comprises means for:
(a) receiving the binary error rate when said threshold value is set at a first value and when said threshold value is set at a second value;
(b) determining a control threshold value which is a function of said first value and said second value; and
(c) applying said threshold control value to said control input.

19. The receiver as claimed in claim 17, wherein said adapting means comprises means for:
(a) initially applying a predetermined value to said control input and receiving from said measuring means the binary error rate when said threshold value is set at said predetermined value, that binary error rate being a first binary error rate;
(b) computing a criterion value based on said first binary error rate value;
(c) repeatedly incrementing said threshold value by a first predetermined step value to an new incremented value and receiving from said measuring means the binary error rate measured when said threshold value is set at the new incremented value until the binary error rate, when said threshold value is set at the new incremented value, exceeds said criterion;
(d) repeatedly decrementing said threshold value by a first predetermined step value to a new decremented value and receiving from said measuring means the binary error rate measured when said threshold value is set at the new decremented value until the binary error rate, when said threshold value is set at the new decremented value, exceeds said criterion;
(e) comparing the binary error rate when said threshold value is set at each new incremented and decremented value to said criterion;
(f) determining a threshold control value by taking the average of (i) the new incremented value at which the binary error rate, measured when said threshold value is set at that new incremented value, exceeds said criterion and (ii) the new decremented value at which the binary error rate, measured when said threshold value is set at that decremented value, exceeds said criterion; and
(g) applying said threshold control value to said control input.

20. The receiver as claimed in claim 19, further comprising means coupled to said adapting means for storing the new incremented threshold value at which the binary error rate, measured when said threshold value is set at that incremented value, exceeds said criterion.

21. The receiver as claimed in claim 19, further comprising means coupled to said adapting means for storing said predetermined value.

22. The receiver as claim in claim 19, wherein said adapting means computes said criterion value by adding a first fixed quantity to the value of said first binary error rate to arrive a total and multiplying the total by a second fixed quantity.

23. The receiver as claimed in claim 19, further comprising permanent-memory sites for storing a plurality of threshold control values.

24. The receiver as claimed in claim 23, wherein each of the threshold control values stored pertains to a different channel.

25. The receiver as claimed in claim 17, further comprising permanent-memory sites for storing a plurality of threshold values.

* * * * *